United States Patent [19]

Filkorn

[11] Patent Number: 5,491,639
[45] Date of Patent: Feb. 13, 1996

[54] PROCEDURE FOR VERIFYING DATA-PROCESSING SYSTEMS

[75] Inventor: Thomas Filkorn, Munich, Germany

[73] Assignee: Siemens Aktiengesellschaft, Munich, Germany

[21] Appl. No.: 133,208
[22] PCT Filed: Apr. 7, 1992
[86] PCT No.: PCT/EP92/00789
§ 371 Date: Oct. 14, 1993
§ 102(e) Date: Oct. 14, 1993
[87] PCT Pub. No.: WO92/18944
PCT Pub. Date: Oct. 29, 1992

[30] Foreign Application Priority Data

Apr. 17, 1991 [DE] Germany ............................ 91106157.0

[51] Int. Cl.$^6$ .................................................. H03K 19/00
[52] U.S. Cl. ............................ 364/488; 364/489; 364/490
[58] Field of Search ...................... 364/488, 489, 364/490, 491, 578, 141, 200, 900; 341/96; 235/155

[56] References Cited

U.S. PATENT DOCUMENTS

| | | | |
|---|---|---|---|
| 3,943,350 | 3/1976 | Lanning | 235/155 |
| 4,799,141 | 1/1989 | Drusinsky et al. | 364/141 |
| 4,876,640 | 10/1989 | Shankar et al. | 364/200 |
| 4,933,897 | 6/1990 | Shankar et al. | 364/900 |
| 5,001,479 | 3/1991 | Becker et al. | 341/96 |
| 5,231,590 | 7/1993 | Kumar et al. | 364/491 |
| 5,243,538 | 9/1993 | Okuzawa et al. | 364/489 |
| 5,258,919 | 11/1993 | Yamanouchi et al. | 364/489 |
| 5,287,289 | 2/1994 | Kageyama et al. | 264/489 |
| 5,331,568 | 7/1994 | Pixley | 364/489 |

OTHER PUBLICATIONS

"CAD Systems for IC Design", by M. E. Daniels et al., IEEE Transactions on Computer–Aided Design of Integrated Circuits and Systems, vol. CAD-1, No. 1, Jan. 1982.

"Verifying ASICs by Symbolic Simulation", Tidén et al., EURO ASIC 90, (1990), pp. 468–473.

"On the Verification of Sequential Machines at Differing Levels of Abstraction", Devades et al, IEEE Transactions on Computer–Aided Design, 7(6), (1988) pp. 713–722.

"A New Method for Verifying Sequential Circuits", K. J. Supowit et al., 23rd ACM/IEEE Design Automation Conference, (1986), pp. 200–207.

"Graph–based Algorithms for Boolean Function Manipulation", Bryant, IEEE Transactions Computer, vol. C–35, No. 8, Aug. 1986, pp. 677–691.

"Sequential Circuit Verification Using Symbolic Model Checking", J. R. Burch et al, 27th ACM/IEEE Design Automation Conference, (1990), pp. 46–51.

"Verification of Sequential Machines Using Boolean Functional Vectors", Coudert et al, Proceedings of the IMEC–IFIP International Workshop on Applied Formal Methods for Correct VLSI Design, Nov. 13–16, 1989, pp. 111–128.

"A Unified Framework for the Formal Verification of Sequential Circuits", Coudert et al, IEEE International Conference on Computer–Aided Design, Nov. 11–15, 1990, pp. 126–129.

Primary Examiner—Kevin J. Teska
Assistant Examiner—Russell W. Frejd
Attorney, Agent, or Firm—Hill, Steadman & Simpson

[57] ABSTRACT

Implementation and specification of synchronous sequential circuits and other data-processing systems can be modeled by finite state machines. The verification, that is to say the comparison between the implementation and the specification of such systems can then be reduced to the comparison between two finite state machines. On the basis of a symbolic representation of finite state machines with the aid of binary decision diagrams, a method for comparing finite state machines has been developed which can be automatically run on computer systems and thus provides the possibility of automatically verifying such circuits without simulation.

8 Claims, 1 Drawing Sheet

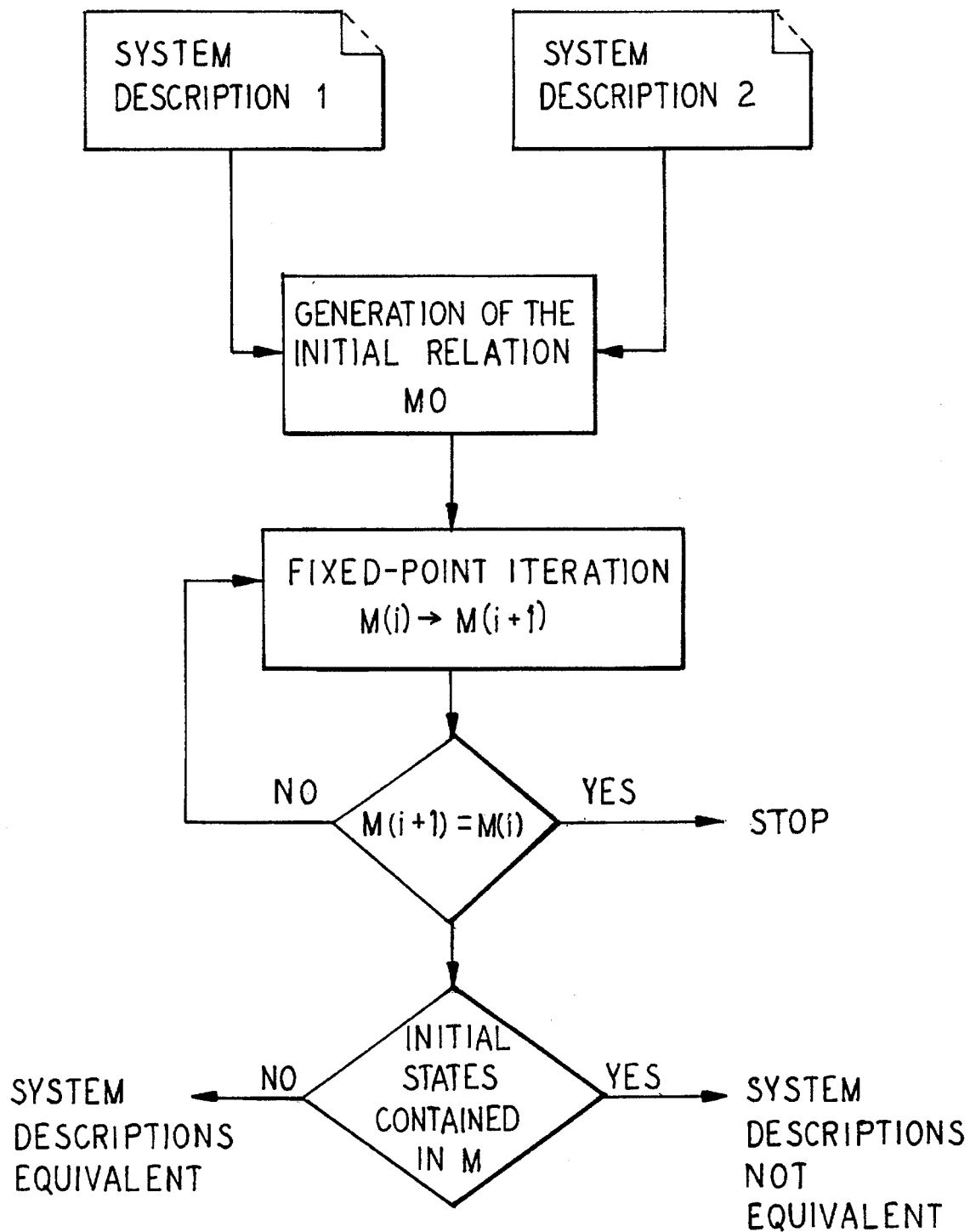

5,491,639

PROCEDURE FOR VERIFYING DATA-PROCESSING SYSTEMS

BACKGROUND OF THE INVENTION

A main reason for unexpected delays and additional costs are errors in the design phase of digital circuits. To avoid these, various simulation procedures are currently used for verifying a logical circuit design. Unfortunately, the number of simulations needed for verifying a circuit or a data-processing system grows exponentially with the number of inputs of combinatorial circuits and even faster for sequential circuits since all possible input sequences must be simulated in these. Although such methods for simulating digital circuits are widely used and have an important place in the design process of such circuits, they are far from suitable for completely checking and verifying circuits which is why the correctness of a circuit, that is to say the correspondence between its actual implementation and its design specification cannot be guaranteed. For this reason, formal verification methods must be preferred to any type of simulation since, in principle, these can prove the complete correctness of a circuit.

Specifications of combinatorial or synchronous sequential circuits are frequently formulated in the form of so-called hardware description languages (HDL). In these cases, formal verification means the comparison of a digital circuit such as is given, for example, in the form of a network list, with its specification in the form of a description, using the methods of a hardware description language. From the literature (Erik Tidén, Richard Schmid, "Verifying ASICs in symbolic simulation", in EURO ASIC 90, 1990), formal circuit verification tools are known, the applicability of which, however, is restricted to combinatorial circuits. The formal verification of sequential digital circuits is much more difficult and only a few approaches to a solution to the problem of verifying digital circuits with a large number of states are known.

SUMMARY OF THE INVENTION

The invention relates to a procedure for verifying data-processing systems, particularly digital circuits, which is based on the symbolic representation of boolean functions with the aid of binary decision diagrams. The invention is based on the object of specifying a procedure for verifying data-processing systems, particularly digital circuits, which is capable of verifying not only combinatorial but also sequential systems of high complexity and thus to overcome the problems of the procedures known in the prior art. This object is achieved with the aid of a procedure for verifying data-processing systems, particularly digital circuits, having the following steps.

Like the procedure known from the prior art, this procedure is also based on the comparison between two formal descriptions, generated independently of one another, of a system to be verified, for example the system specification formulated with the aid of a hardware description language and the circuit implementation present, for example, in the form of a network list. The procedure according to the invention uses a special representation of boolean functions with the aid of binary decision diagrams or equivalent means. This special and advantageous representation of boolean functions enables the comparison of both system descriptions to be carried out with the aid of a fixed-point iteration, with the aid of which non-equivalent states of the two system descriptions are found. For this purpose, the two system descriptions to be compared with one another are modeled as Mealy automata. The fixed-point iteration is used for representing the set of non-equivalent states of the two Mealy automata in the form of binary decision diagrams or equivalent means. To carry out the fixed-point iteration, the output and transitional functions of the two Mealy automata are also represented by binary decision diagrams or equivalent means.

The form of representation by binary decision diagrams according to the invention produces an extremely efficient storage of the data structures of the procedure and enables the operations necessary for carrying out the procedure to be restricted to simple substitutions and boolean operations to binary decision diagrams. It is this which makes the procedure applicable at all in practice for systems which are technically of interest.

The procedure according to the invention can be used for verifying data-processing systems of various types such as, for example, digital circuits, communication protocols, computer programs and microprograms. The procedure can be used for verifying any technical system which can be modeled as Mealy automaton.

Advantageous developments of the present invention are as follows.

The data-processing systems are digital circuits. The digital circuit to be verified is described in the form of two network lists, or the digital circuit to be verified is described in the form of a network list with the aid of a hardware description language. Alternatively, the data-processing systems are communications protocols, computer programs, or microprograms.

In a further development, the set MO of all state pairs is generated which generate at least one different output value for at least one set of input values. The set MO is extended by the set of all state pairs which in a finite number of steps of the two Mealy automata, lead to a state pair which belongs to the set MO.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in the several Figures of which like reference numerals identify like elements, and in which:

The single FIGURE shows a flow chart of the procedure.

DESCRIPTION OF THE PREFERRED EMBODIMENT

In the text which follows, the invention will be described in greater detail with reference to a special illustrative embodiment. A flowchart of the procedure is depicted in the single FIGURE. The most important fundamental terms needed for this are explained at the beginning for reasons of better comprehensibility. For the rest, the terms and notations used here are familiar to the expert in this field and can be found, for example, in the publications by W. Brauer, "Automatentheorie" (Theory of Automata), B. G. Teubner, 1984 or Z. Kohavi, "Switching and Finite Automata Theory", McGraw-Hill Book Edition, 1978.

In synchronous sequential digital circuits, all elements having internal states such as, for example, flip flops, latches, registers and storing elements are triggered with the aid of a global clock signal so that all elements simultaneously change their state on a clock-signal transition. The new state of a synchronous sequential digital circuit exclusively depends on its instantaneous state and the values of the input signals. Thus, the output signals of the digital circuit also only depend on the input signals and the internal state of this circuit. For this reason, the behavior of a synchronous sequential digital circuit can be modeled by the model of the finite state machine, more accurately called Mealy automaton (Z. Kohavi, 1978, W. Brauer, 1984). Both the specification of a synchronous sequential digital circuit and its implementation can therefore be considered as Mealy automaton. In this connection, the implementation of such a digital circuit will be frequently available in the form of a so-called network list. The specification can be advantageously made with the aid of a transition table or a suitable hardware description language. To verify a synchronous sequential digital circuit means to compare an implementation of this circuit with its specification. Because both descriptions can be modeled by Mealy automata, this problem can be reduced to the comparison of two differently described Mealy automata. The following definitions of finite deterministic Mealy automata and of the equivalence between two Mealy automata are normally used in the theory of automata (Z. Kovahi, 1978; W. Brauer, 1984). These definitions will be briefly summarized here for reasons of better comprehensibility.

A finite deterministic Mealy automaton is given by specifying an alphabet of input variables, a finite set of states, an alphabet of output variables, an output function which allocates a value of the output variables to each value of the input variables and of the states, a transition function which allocates a state to each input value and state, and an initial state.

A deterministic Mealy automaton defines a partial map which allocates a word from elements of the alphabet of the output variables to each word of elements of the alphabet of input variables. If a sequence of input variables is input into the automaton, a sequence of output variables is allocated to this sequence, new state variables first being calculated from the input variables with the aid of the transition function and thereupon the new output variables being calculated from the state variables and the input variables with the aid of the output function. If the automaton is considered from the outside, these allocations are the only thing which can be observed about its behavior and it is therefore natural to consider two deterministic Mealy automata as equivalent if they have a corresponding input and output alphabet and if their allocations described above are equivalent. The map is here called partial because the transition function and the output function are generally only partially defined functions. By completing these functions, which is described, for example, in Z. Kohavi, 1978, the problem of the comparison of two incompletely described automata can be reduced to a comparison of two completely described automata. In the text which follows, it is therefore assumed that the output and transition function are completely defined functions and therefore only the problem of the comparison of two completely deterministic Mealy automata is considered.

Two states of two deterministic Mealy automata with corresponding input and output alphabets are called equivalent especially if a) the values of their output functions for these two states correspond when The input signals are in each case identical, and b) for all values of the input signals which are equivalent to states resulting from these states from their transition functions when the input signals are in each case identical.

Two deterministic Mealy automata having identical input and output alphabets are only called equivalent when their initial states are equivalent.

A standard procedure for checking the equivalence of two Mealy automata is described in the report by Z. Kohavi, 1978: For this purpose, the product automaton is described for two Mealy automata having identical input and output alphabets by using the common input alphabet which forms the basis of the two original Mealy automata as input alphabet of the product automaton, selecting the set of states of the product automaton to be equal to the cartesian product of the state set of the output automata, allowing the output alphabet of the product automaton to comprise the two boolean values "true" and "false", respectively, allocating to the output function of the product automaton the value "true" if the output functions of the original automata correspond to one another, allocating the value "false" to the output function of the product automaton if the output functions of the original automata do not correspond to one another, and allocating the double-tuple formed from the values of the transition functions of the original automata to the transition function of the product automaton. Using this definition, the two definitions on the equivalence of two states of two deterministic Mealy automata and the definition on the equivalence of Mealy automata can be formulated as follows:

The relation of equivalence between states of two deterministic Mealy automata is the greatest relation on the cartesian product of the two state spaces of two Mealy automata having the following characteristic:

An element of the product state space only belongs to the relation if the following holds true for all input values:

The output function of the product automaton assumes the value "true" for this element of the product state space and the pattern of the transition function also belongs to the relation. Two deterministic Mealy automata are only then called equivalent if all states of the product state space, formed from the initial states of these two automata, belong to this relation of equivalence, The known procedures (O. Coudert, Ch. Berthet, J. Ch. Madre, "Verification of sequential machines using boolean functional vectors", in IMEC-IFIP International Workshop on Applied Formal Methods For Correct VLSI Design, 1989; S. Devadas, Hi-Keung Tony Ma, R. Newton, "On the verification of sequential machines at differing levels of abstraction", IEEE-Transactions on Computer-Aided Design, 7(6): 713–722, 1988; K. J. Supovit, S. J. Friedman, "A new method for verifying sequential circuits, in 23rd ACM/IEEE Design Automation Conference, 1986) for checking the equivalence of two synchronous sequential circuits (Mealy automata) are based on an initial state of the product automaton and search for a transition at which the output function of the product automaton assumes the value "false", which signals a difference in the output behavior of the two original machines. If no such transition is found after having worked through the entire accessible state space of the product machine, the equivalence of the original Mealy automata and thus of the synchronous sequential circuits to be compared is proven.

The explicit design of the state diagram (K. H. Supovit, S. J. Friedman 1986) of the product automaton is a process which consumes a lot of memory space and is therefore only considered for verifying with automata having only a very few states such as belong, for example, to control circuits. Other procedures (O. Coudert, et al., 1989) investigate the product automaton without explicitly constructing its state diagram. The investigation of the product automaton begins with an initial state of the product automaton and with each new state a check is made whether no transition generates the output "false" which would indicate a different behavior of the original automata. In such an investigation of the product automaton, two different strategies are basically available for bookkeeping on all states generated:

The first strategy can be called depth-first strategy (S. Devadas et al., 1988). This strategy has the disadvantage that its complexity grows linearly with the number of achievable states. For this reason, only automata having a very small number of states (for example 2,764 in the example in the report by S. Devadas et al., 1988) can be compared with the aid of this strategy. The second possible strategy can be called breadth-first strategy (O. Coudert et al., 1989). In this strategy, a number of states instead of only one state as in the depth-first strategy are dealt with in one step so that this strategy can profit from an efficient representation of sets with the aid of binary decision diagrams (R. E. Bryant, "Graph-based algorithmus for boolean function manipulation", IEEE Transactions Computer, C-35 (12): 1035–1044, 1986). The advantages of this procedure have been demonstrated with the aid of examples in which automata with up to 22 million states have been verified. Nevertheless, the complexity of a breadth-first investigation grows linearly with the length of the longest cycle in the accessible part of the product machine and therefore quite a large class of interesting automata such as, for example, counters, cannot be compared with the aid of such a procedure. Another problem of the procedure by Coudert et al. consists in that it is necessary to alternate between different representations for carrying out this procedure and that the alternation between these representations requires operations with exponential complexity.

To overcome the problems which are associated with the processing of the accessible state space of a product automaton and the adequate representation of Mealy automata, another procedure is used. The definition of the equivalence of two states or of the equivalence of two Mealy automata reveals that in the case where two non-equivalent states exists, there must be a finite input sequence for which the associated output sequences of the two Mealy automata differ. It is therefore assumed that in most cases which are of practical interest, a very short input sequence exists which has this characteristic since, when two states are not equivalent, this should be observable at the output after a short time when a suitable input sequence is used. Thus, instead of generating the entire accessible state space and checking the equivalence of all states as is done in the procedure from the literature, the entire relation of the non-equivalent states, that is to say the complement of the set of equivalent states in the product space of the states is calculated in the procedure according to the invention. The calculation is carried out by means of a fixed-point iteration in which only simple operations on binary decision diagrams are needed.

To carry out this iteration, the set of all state pairs is considered as starting point, that is to say the set of all states of the product automaton of the Mealy automata to be checked which have different output values for at least one input pattern. This output set is then expanded step by step by those state pairs for which it holds true that from them, the state pairs of the original set can be reached in a finite number of steps, assuming suitable input patterns, by using the transition functions of the Mealy automata to be verified or the transition function of the product automaton. This iteration ends if the set of state pairs generated during the process no longer changes, that is to say if a fixed point is reached. From the definition of the equivalence of Mealy automata it is clear that this fixed-point set is the set of all non-equivalent states.

These are therefore all non-equivalent state pairs of the Mealy automata to be compared. These are then equivalent if their initial states are equivalent. The only thing that remains is thus to check whether the initial states of the Mealy automata to be compared, or the state pairs formed from these states, are elements of the fixed-point set generated or not. This procedure has the advantage that the fixed-point set is already constructed after a very few steps in all cases investigated in practice. Besides, this procedure has the advantage that all operations needed for constructing the fixed-point set can be implemented very efficiently with the aid of binary decision diagrams. These are described in detail in the report by Bryant 1986 (R. E. Bryant, "Graph based algorithm for boolean function manipulation", IEEE Trans. Computer, C-35 (12): 1035–1044, 1986).

In the case of synchronous sequential digital circuits, the states and input and output signals respectively of the Mealy automata modeling these circuits are boolean vectors and the output and transition functions are defined as vector-valued boolean functions, the arguments of which are boolean vectors. To represent such boolean functions and the operations on them, Bryant (R. E. Bryant, 1986) has introduced the binary decision diagrams (BODS). Binary decision diagrams only have advantageous characteristics for particular classes of boolean functions since the magnitude of a binary decision diagram which represents a boolean function is in the worst case an exponentially growing function of the number of arguments of this boolean function. On the other hand, empirical investigations have found that boolean functions which are implemented by combinatorial or sequential digital circuits have compact representations for binary decision diagrams and that binary decision diagrams can be advantageously used for representing sequential digital circuits.

In the abovementioned fixed-point iteration procedure for generating the relation of the non-equivalent states of two Mealy automata, a method for representing the sets which are generated in the course of the fixed-point iteration procedure is needed. These sets are relations over the cartesian product of the state spaces of both Mealy automata, that is to say subsets of a binary unit cube of corresponding dimensions. Each subset U of a k-dimensional binary cube can be described by its characteristic function which allocates the value 1 to each point of the binary cube which, at the same time, is an element of the set U, and allocates the value 0 to all other elements of the cube. The characteristic function of an average set of two sets corresponds to the AND combination of both characteristic functions of these sets, the characteristic function of a set union of the OR combination and the characteristic function of a differentiation of the AND combination of the characteristic functions of the output set with the characteristic function of the complement of the subtracted set. In the report by J. R. Burch et al., "Sequential circuit verification using symbolic model checking", in ACM/IEEE Design Automation Conference, 1990, the corresponding transition relation is used instead of the transition function for modeling a synchronous sequential digital circuit. This transition relation is represented with the aid of a binary decision diagram of the characteristic function of this transition relation. Empirical investigations have shown that the representation of synchronous sequential digital circuits and of combinatorial digital circuits with the aid of functional vectors of binary decision diagrams has advantages compared with a representation in the form of characteristic functions since they are apparently capable of representing circuits of high complexity.

The implementation of the fixed-point procedure for calculating the relation of the non-equivalent states of two Mealy automata will now be described on the basis of the representation of Mealy automata and relations with the aid of boolean functions and thus by means of binary decision diagrams. The first step for preparing the fixed-point iteration consists in calculating the output relation MO to which all state pairs formed from two states of the two Mealy automata belong, for which it holds true that at least one input signal exists for which the output functions of the two Mealy automata assume different values for the two states. If the output functions of the two Mealy automata are given as vectors of binary decision diagrams, it is simple to calculate the characteristic function of the output relation.

For this purpose, the associated binary decision diagrams are "EXOR" combined from the vectors of binary decision diagrams of the output functions for each individual output. Thus, for each output one binary decision diagram is calculated which supplies the value "true" for exactly the state pairs and input signals for which this output supplies a different value in both Mealy automata. An existence operator with respect to the inputs is then applied to each of these binary decision diagrams. A binary decision diagram thus calculated outputs the value "true" exactly for the pairs of states for which at least one input signal exists so that the original binary decision diagram supplies the value "true", that is to say the output supplies a different value. The existence operator on a binary decision diagram with respect to a set of inputs can be progressively calculated with respect to a single input by the existence operator. For this purpose, the existence operator with respect to the first input is calculated onto the original binary decision diagram. Onto the binary decision diagram produced, the existence operator with respect to the second input is calculated. This procedure is continued until the last input is reached. To calculate an existence operator with respect to an input, the input is substituted by "true" or respectively "false" in the binary decision diagram and the two binary decision diagrams produced are OR-combined. The existence operator can thus be reduced to simple substitution and OR combination. After the existence operator has been applied, the binary decision diagrams produced for the individual outputs are all still OR-combined and the result is a binary decision diagram which represents the characteristic function for MO. An explicit calculation of the intermediate results is not absolutely necessary but the entire calculation of MO from the vectors of the binary decision diagrams for the output functions as described above can also be fused into a single strip.

The output relation MO is the starting point for the fixed-point iteration which calculates further relations from the output relation.

During the progression of the iteration procedure, the characteristic function of the relations M(i) occurring in the meantime is calculated from the preceding characteristic functions by means of the following steps:

In the binary decision diagram of the characteristic function for M(i), the states are replaced by the binary decision diagrams of their state transition functions. This corresponds to substituting binary decision diagrams for variables in binary decision diagrams. The calculated binary decision diagram produces the value "true" for each pair of states and each input signal exactly when the subsequent states of the states considered, under the action of the transition function of the Mealy automata, have the characteristic that the characteristic function of the relation M(i) of this iteration step has the value "true". The existence operator with respect to the input signals is applied to the calculated binary decision diagram and the result is OR-combined with the binary decision diagram of the characteristic function of the relation M(i). Thus, the relation M(i) is extended by precisely the pairs of states for which at least one input signal exists so that the subsequent states are contained in the relation M(i). Thus, only insertion, that is to say substitution and OR combination on binary decision diagrams are required for carrying out the iteration step since the existence operator can be reduced to substitution and OR combination as described before. An explicit calculation of the intermediate results is not absolutely necessary but the entire calculation described above can be fused into a single operation.

In effect, these operations are equivalent to a union of subsets of the product state space in which the set M(i) which represents the relation of this iteration step is joined with the set of predecessor state pairs under the action of the transition functions of the Mealy automata to be compared in order to obtain the set M(i+1) which represents the relation of the subsequent iteration step.

The iteration procedure is terminated when an iteration step does not lead to any change in the relation. To detect this, a simple comparison of two successive binary decision diagrams which represent the characteristic functions of the relations is required.

The Mealy automata to be compared are equivalent when their initial states do not belong to the relation M of the non-equivalent states.

The representation of Mealy automata with the aid of vectors of functions, that is to say binary decision diagrams, can be combined in a simple and elegant manner with the representation of sets by their characteristic functions with the aid of the above substitutions. The procedure by Coudert et al. (O. Coudert 1989) needs an explicit transformation of the two representations into one another even though this is associated with operations of exponential complexity. The iteration procedure comes to a standstill if the sets generated or relations between two iteration steps are identical. This identity is performed by evaluating the binary decision diagrams of the characteristic functions which are represented by these sets.

This completes the description of the implementation of the entire fixed-point procedure on the basis of binary decision diagrams. The only operations on binary decision diagrams which are needed within the fixed-point iteration are the boolean functions "OR" or "not equal to" and the substitution of variables of boolean functions or of decision diagrams, respectively.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for verifying data-processing systems, comprising the steps of:

a) representing two descriptions, generated independently of one another, of a system to be verified as Mealy automata and comparing the two descriptions to one another;

b) carrying out the comparison with a fixed-point iteration procedure which initially generates a first set of all state pairs which generate at least one different output value for at least one set of input values, and which iteratively extends said first set by a second set of all state pairs which, in a finite number of steps of the two Mealy automata, lead to a state pair which belongs to the first set, until a fixed-point set of all non-equivalent state pairs is generated, the two Mealy automata being equivalent when their initial states or the state pairs formed from these states do not belong to the fixed-point set;

c) representing equivalence relations between states, output and transition functions of the two Mealy automata by binary decision diagrams; and d) applying in each step of the fixed-point iteration, only boolean operations and substitutions to binary decision diagrams.

2. The method as claimed in claim 1, wherein the data-processing systems are digital circuits.

3. The method as claimed in claim 2, wherein a digital circuit to be verified is described in the form of two network lists.

4. The method as claimed in claim 2, wherein a digital circuit to be verified is described in the form of a network list with the aid of a hardware description language.

5. The method as claimed in claim 1, wherein the data-processing systems are communication protocols.

6. The method as claimed in claim 1, wherein the data-processing systems are computer programs.

7. The method as claimed in claim 1, wherein the data-processing systems are microprograms.

8. The method as claimed in claim 1, wherein in the step of carrying out the comparison: the first set of all state pairs generate at least one different output value for at least one set of input values; and the first set is extended by a set of all state pairs which, in a finite number of steps of the two Mealy automata, lead to a state pair of which belongs to the first set.

* * * * *